US006800415B2

(12) United States Patent
Lu et al.

(10) Patent No.: US 6,800,415 B2
(45) Date of Patent: Oct. 5, 2004

(54) NEGATIVE-ACTING AQUEOUS PHOTORESIST COMPOSITION

(75) Inventors: Ping-Hung Lu, Bridgewater, NJ (US); Mark O. Neisser, Three Bridges, NJ (US); Ralph R. Dammel, Flemington, NJ (US); Hengpeng Wu, Hillsborough, NJ (US)

(73) Assignee: Clariant Finance (BVI) Ltd, Tortola (VG)

(*) Notice: Subject to any disclaimer, the term of this patent is extended or adjusted under 35 U.S.C. 154(b) by 182 days.

(21) Appl. No.: 09/966,958

(22) Filed: Sep. 28, 2001

(65) Prior Publication Data

US 2003/0077539 A1 Apr. 24, 2003

(51) Int. Cl.⁷ .......................... G03C 1/73; G03F 7/038; G03F 7/20; G03F 7/30
(52) U.S. Cl. ................. 430/270.1; 430/325; 430/328; 430/905; 430/909; 430/910; 430/914; 430/921; 430/927
(58) Field of Search .............................. 430/270.1, 909, 430/914, 921, 927, 325, 905, 328, 910

(56) References Cited

U.S. PATENT DOCUMENTS

| | | | |
|---|---|---|---|
| 5,017,462 A | 5/1991 | Stahlhofen et al. | 430/325 |
| 5,532,113 A | 7/1996 | Frechet et al. | 430/396 |
| 5,536,616 A | 7/1996 | Frechet et al. | 430/191 |
| 5,648,196 A | 7/1997 | Frechet et al. | 430/270.1 |
| 5,691,101 A | * 11/1997 | Ushirogouchi et al. | 430/176 |
| 5,858,620 A | 1/1999 | Ishibashi et al. | 430/313 |
| 5,998,092 A | 12/1999 | McCulloch et al. | 430/270.1 |

OTHER PUBLICATIONS

Kanda et al., "Advanced Microlithography Process with Chemical Shrink Technology", Advances in Resist Technology and PRocessing XVII, vol. 3999 (2000), p. 881–889.*
Jennifer M. Havard, et al, X {–002230263, "Design of Photoresists with Reduced Environmental Impact.1. Water-Soluble Resists Based on Photo–Cross–Linking of Poly(vinyl alcohol)", Chemistry of Materials, vol. 11, No. 3, 1999, pp. 719–725.
Jennifer M. Havard et al, "Photoresists with Reduced Environmental Impact: Water–Soluble Resists Based on Photo–Cross–Linking of a Sugar–Containing Polymethacrylate", American Chemical Society, vol. 32, 1999, pp. 86–94.
Qinghuang Lin et al, "A Water–Castable, Water–Developable Chemically Amplified Negative–Tone Resist", American Chemical Society, vol. 9, 1997, pp. 1725–1730.
Tashio Sakamizu et al, Water–Soluble Onium Salts: New Class of Acid Generators for Chemical Amplification Positive Resists, American Chemical Society, vol. 614, 1995, pp. 124–136.
Jennifer M. Havard et al, Design of Photoresists with Reduced Environmental Impact. 1. Water–Soluble Resists Based on Photo–Cross–Linking of Poly(vinyl alcohol), American Chemical Society, vol. 11, 1999 , pp. 719–725.

* cited by examiner

Primary Examiner—Mark F. Huff
Assistant Examiner—Sin J. Lee
(74) Attorney, Agent, or Firm—Sangya Jain

(57) ABSTRACT

The invention relates to a novel negative, aqueous photoresist composition comprising a polyvinylacetal polymer, a water-soluble photoactive compound and a crosslinking agent. The water-soluble photoactive compound is preferably a sulfonium salt. The invention also relates to forming a negative image from the novel photoresist composition.

12 Claims, 3 Drawing Sheets

Contrast Curve for Photoresist Example 1.

Contrast Curve for Photoresist Example 3.

Contrast Curve for Photoresist Example 4

US 6,800,415 B2

NEGATIVE-ACTING AQUEOUS PHOTORESIST COMPOSITION

FIELD OF INVENTION

The present invention relates to a water based negative photoresist composition that is particularly sensitive at wavelengths below 260 nanometers (deep ultraviolet), and a process for imaging such a photoresist.

BACKGROUND OF INVENTION

Photoresist compositions are used in microlithographic processes for making miniaturized electronic components such as in the fabrication of computer chips and integrated circuits. Generally, in these processes, a thin film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited. In a positive-working photoresist the developer removes the portions that are exposed. During the manufacture of devices it is sometimes desirable to use negative-acting photoresists to form images on a substrate.

The use of a negative-working, acid-sensitive photoresist composition is known in the prior art. Most of such prior art photoresist compositions use a crosslinking agent that reacts with the polymeric binder resin to form an insoluble film comprising a higher molecular weight polymer. Traditionally negative photoresists have been cast from organic solvents and developed using aqueous base developers. However, due to growing environmental concerns, negative photoresists that can be coated from a safe solvent, such as water or predominantly water, are highly desirable. Therefore, photoresists that are negative and water based are needed by the semiconductor industry. Furthermore, the trend toward miniaturization of integrated circuits has led to the development of photoresists that absorb at smaller and smaller wavelengths. Currently photoresists that can be imaged by wavelengths of light below 260 nanometers (nm) known as deep ultraviolet (DUV), are preferred. Thus, photoresists that are negative, water based and sensitive below 260 nm are even more desirable.

Aqueous based negative photoresists typically comprise a polymer, photoactive compound and crosslinking agent, where all the solid components are soluble in water or where water is the predominant solvent. Further, for photoresist that must be photoactive at wavelengths below 260 nm, the polymers and the crosslinking agent should be essentially nonabsorbing at the imaging wavelengths, this being particularly critical for the polymer, since it is the predominant proportion of the photoresist film. Polymers with minimal amounts of aromatic functionality, are desirable for imaging below 260 nm, and polymers with no aromatic functionality are especially desirable for imaging below 200 nm. Photoactive compounds that are essentially water-soluble and absorb at the exposure wavelength to generate an acid are required. Photoactive compounds that are based on derivatives of sulfonium salts that are water-soluble and undergo efficient photochemical transformation are particularly suitable. Similarly, crosslinkers that are essentially water-soluble and are very efficient crosslinkers in the presence of an acid are needed.

Examples of aqueous negative photoresists have been disclosed previously by Harvard et al (Macromolecules 1999, 32, 86–94 and Chem. Mater. 1999, 11, 719–725). Harvard et al (Chem. Mater. 1999, 11, 719–725) describes a photoresist composition based on polyvinylalcohol, (2,4-dihydroxyphenyl)dimethyl sulfonium triflate and hexamethoxymethymelamine in water.

Dimethylmultihydroxyphenylsulfonium salts are also disclosed in U.S. Pat. No. 5,648,196, but the polymers described therein contain aromatic functionality. Sakamizu et al (ACS Symposium Series, 614,124–36, 1995) evaluates photoresists containing aromatic polymers and water-soluble sulfonium salts. In Macromolecules 1999, 32,86–94, Harvard et al describes a two component water-soluble photoresist that uses (4-methoxyphenyl)dimethylsulfonium trifluoromethanesulfonate to transacetalize polymethacrylate containing sugar fuctionality.

U.S. Pat. No. 5,858,620 discloses a process for coating an imaged photoresist pattern with a nonphotosensitive aqueous solution of polyvinylacetal, or a mixture of polyvinylacetal and a crosslinking agent, and heating the solution to form a crosslinked coating over the photoresist pattern. The objective of this process is to reduce the dimensions of the open spaces on the substrate.

The present invention relates to a novel negative, aqueous photoresist composition comprising a polyvinylacetal polymer, a water-soluble photoactive compound and a crosslinking agent. The invention also relates to a process for forming a negative image from the novel photoresist composition.

SUMMARY OF THE INVENTION

The present invention relates to a novel negative aqueous photoresist composition, comprising a polymer comprising at least one unit with the structure (1),

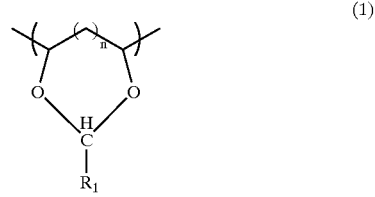

where,
$R_1$ is hydrogen or ($C_1$–$C_4$) alkyl and n=1–4; a water-soluble photoactive compound; a crosslinking agent; and, a solvent composition.

The preferred photoactive compound has the structure (2),

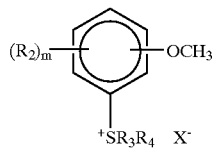

(2)

where,
$R_2$ is independently hydrogen, alkyl, —O(alkyl), -(alkyl)OH, hydroxyphenyl or multihydroxyphenyl, $R_3$ and $R_4$ are independently $(C_1-C_4)$ alkyl, m=1–3, and, $X^-$ is an anion. The solvent for the photoresist composition is preferably water or water and a $(C_1-C_4)$ alkyl alcohol.

The invention further relates to a process for forming a negative image using the photoresist composition of this invention.

DESCRIPTION OF THE INVENTION

Figure 1:
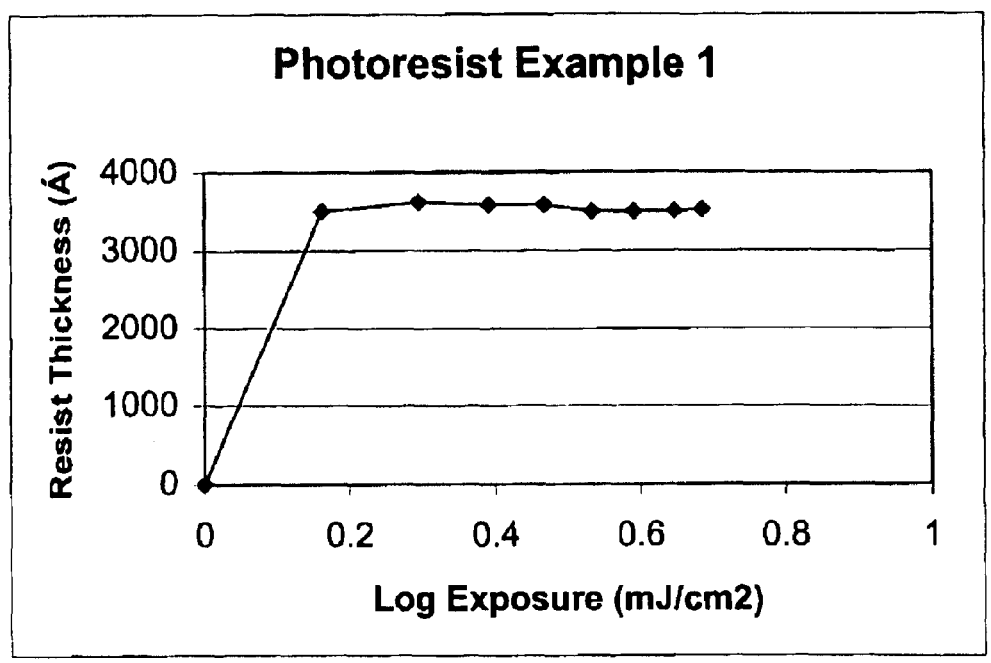
FIG. 1 shows the contrast curve for Photoresist Example 1.

The present invention relates to a novel negative acting photoresist composition that is castable from water, or primarily water, and is preferably sensitive at wavelengths below 260 nm. The photoresist composition comprises a water-soluble polymer, a water-soluble photoactive compound and a water-soluble crosslinking agent. The invention further relates to a process for forming a negative image from the novel photoresist composition. The preferred wavelengths used to image the photoresist are 254 nm, 248 nm, 193 nm and 157 nm. Throughout the present application, water-soluble materials are those that are soluble in only water or a mixture containing primarily water and a minor amount of water miscible solvent, such as a lower $(C_1-C_4)$ alkyl alcohol.

The water-soluble polymer of the present invention is capable of being crosslinked in the presence of photogenerated acid and a crosslinking agent. The polymer comprises at least one unit with structure (1),

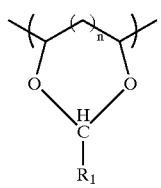

(1)

where $R_1$ is hydrogen or $(C_1-C_4)$ alkyl, and n 1–4.

The polymer of this invention is generally referred to as a polyvinylacetal polymer, where in structure 1, $R_1$ can be hydrogen, methyl, ethyl, propyl or butyl. The polymer backbone for the acetal unit may comprise a carbon chain of 1–4 atoms, and preferably n has a value of one. Copolymers containing the vinyl acetal unit and any other nonaromatic monomer unit may be used, providing the polymer is essentially soluble in water. Examples of nonaromatic comonomers are, amongst others, vinyl alcohol, vinyl acetate, acrylamide, and vinyl pyrollidone. One method of making polyvinylacetal is the reaction of polyvinyl alcohol with an aldehyde. Depending on the points of acetalation, free units of methylene alcohol are possible within the polymer. The vinyl acetal monomer mole percentage can range from 10 mole % to 100 mole %, preferably 15 mole % to 50 mole %. The weight average molecular weight of the polymer can range from 500 to 15,000.

The photoactive compounds of the invention are those that are essentially water-soluble and generate an acid upon exposure to ultraviolet light, with wavelength below 450 nm. Examples of such photoactive compounds are water-soluble onium salts and diazonium salts. Particularly useful for imaging are water-soluble photoactive compounds of structure (2),

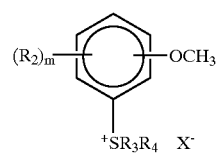

(2)

where,
$R_2$ is hydrogen, $(C_1-C_4)$ alkyl, —O(alkyl), -(alkyl)OH, hydroxyphenyl or multihydroxyphenyl, $R_3$ and $R_4$ are independently $(C_1-C_4)$ alkyl, m=1–4, and $X^-$ is an anion, such as multifluoroalkylsulfonate. In this application, alkyl generally refers to a carbon chain containing one to four carbon atoms, examples of which are methyl, ethyl, propyl, and butyl. It has been found that when R is hydroxyl, the photoactive compound can induce crosslinking in the photoresist composition without exposure, at room temperature, and hence reduce the shelf stability of the composition. It is important for the photoresist composition to have sufficient shelf stability so that consistent lithographic performance is maintained. A preferred embodiment for the sulfonium salt is where $R_2$ is hydrogen, $R_3$ and $R_4$ are both methyl and X is trifluoromethanesulfonate.

Crosslinking agents that are water soluble and can crosslink the polymer in the presence of a photogenerated acid are useful for the present invention. Examples of such crosslinking agents are melamine resins, urea resins, and glycolurils. Specifically, the following crosslinking agents may be used: methoxymethylol melamine resins, methoxymethylol urea resins, and Cymel® resins.

Generally the solid components of the present invention are dissolved in water or water with alcohol. The solvent is largely water, preferably deionized water. Some amount of lower $(C_1-C_4)$ alkyl alcohols that are miscible with water, such as ethanol or isopropanol may be added to water to form a solvent mixture that dissolves the solid components. A typical solvent mixture can be water and alcohol in the ratio ranging from 20 weight % to 1 weight % of the alcohol.

Other additives may be added to the photoresist composition to improve performance properties such as coating uniformity and shelf stability. Examples of such additives are bases, striation free additives, surfactants and dyes.

Typical photoresist compositions of the present invention may comprise up to about 50 percent by weight of the solids, based on the total weight of the photoresist composition. The solids may comprise from 1 to 20 weight percent of the photoacid generator, 40 to 95 weight percent of the phenolic resin binder and from 5 to 40 weight percent of the crosslinking agents, based on the total solids content of the photoresist composition.

The prepared photoresist solution can be applied to a substrate by any conventional method used in the photoresist art, including dipping, spraying, whirling and spin coating. When spin coating, for example, the photoresist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, organic films, silicon dioxide, doped silicon dioxide, silicon nitride, tantalum, copper, polysilicon, ceramics, aluminum/copper mixtures; gallium arsenide and other such Group III/V compounds.

The photoresist composition solution is then coated onto the substrate, and the substrate is heat treated. This temperature treatment is selected in order to reduce the concentration of residual solvents in the photoresist, while not causing substantial thermal degradation of the photosensitive component. In general, one desires to minimize the concentration of solvents and this first temperature treatment is conducted until substantially all of the solvents have evaporated and a thin coating of photoresist composition, on the order of one micron in thickness, remains on the substrate. The heat treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, in any desired pattern, produced by use of suitable masks, negatives, stencils, templates, etc. The photoresist is then subjected to a post exposure second baking or heat treatment, before development. The temperature and time of baking is optimized to give the appropriate amount of crosslinking in the photoresist film. Typical temperatures range from 100° C. to 200° C., and the time can vary from 30 seconds to 30 minutes.

The exposed negative-acting photoresist-coated substrates are developed to remove the unexposed areas, normally by immersion or spray development in water or an alkaline developing solution. The solution is preferably agitated, for example, by nitrogen burst agitation. The substrates are allowed to remain in the developer until all, or substantially all, of the photoresist coating has dissolved from the unexposed areas. The developer can be water, mixture of water and $(C_1-C_4)$alkyl alcohol or a mixture of water and surfactant. A preferred mixture is water and isopropanol. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthetic Example 1

Synthesis of (4-methoxyphenyl)dimethylsulfonium trifluoromethanesulfonate 42.2 g of $AgCF_3SO_3$ and 25.0 g of 1-methoxy-4-(methylthio)-benzene were dissolved in 500 ml of tetrahydrofuran. While stirring, 23.5 g of $CH_3I$ was dropwise added. After the addition was completed, the mixture was stirred for 12 hours; the AgI formed was filtered. If the filtrate is still cloudy, either let the solution stand for at least 12 hours until clear or add sodium chloride to precipitate the unreacted $Ag^+$. Then filter again. The filtrate should be clear after either treatment. The filtrate was added dropwise to 4-fold of ether under stirring. The product was filtered and then washed thoroughly with ether. The product was redissolved in $CH_2Cl_2$ and the residue filtered out. The product was then dried in vacuum at 50° C. and analysed with a $^1H$ NMR. The NMR results were: (acetone-d 6): δ 8.05 (d, 2H), 7.22 (d, 2H), 3.91 (s, 3H) and 3.41 ppm (s, 6H).

Photoresist Example 1

An aqueous negative resist solution was prepared by adding 0.05 gram of the water-soluble photoactive compound synthesized in Synthesis Example 1 to 99.95 grams of R200 solution (available from Clariant Corp., Electronic Materials Business Unit, Somerville, N.J. 08876). R200 is a mixture of polyvinylacetal and ethylene urea resin (crosslinker) in a water/isopropanol 94/6 weight % solution.

Photoresist Example 2

0.081 gms of 0.4956% tetrabutyl ammonium hydroxide (TBAH) aqueous solution was added to 40.124 g of Photoresist Example 1.

Photoresist Example 3

0.6045 g of 0.4956% tetrabutyl ammonium hydroxide (TBAH) aqueous solution was added to 148.85 g of R200 and 0.15 g of the water-soluble photoactive compound synthesized in Synthesis Example 1.

Photoresist Example 4

0.30 g of 0.4956% tetrabutyl ammonium hydroxide (TBAH) aqueous solution was added to 149.925 g of R200 and 0.075 g of the water-soluble photoactive compound synthesized in Synthesis Example 1.

Lithographic Example 1

The solutions from Photoresist Example 1 and 2, were coated on 6" HMDS primed silicon wafers, and then soft baked at 70° C. for 60 seconds to give 0.48 micron ($\mu$m) film thickness. The coated silicon wafers were exposed on an ASML DUV stepper with 248 nm wavelength of light. A dose-to-clear (DTC) pattern was imaged starting at 5 $mJ/cm^2$ with 1 $mJ/cm^2$ energy increments. Illumination Mode was set at Conventional, NA 0.57, and outer sigma 0.75. After exposure the wafers were baked at 130° C. for 70 seconds.

The wafers were then immersed in AZ® R2 developer (mixture of water and isopropyl alcohol) available from Clariant Corp., Electronic Materials Business Unit, Somerville, N.J. 08876. All of the film from the unexposed area was cleared within 16.2 seconds. This step was followed by a deionized water rinse for 60 seconds and the film dried. No photoresist coating remained on the unexposed area and the exposed 10×10 DTC pattern could be observed clearly on wafers coated with Photoresist Example 1 and Photoresist Example 2 giving sharp square pattern photoresist images.

The photoresist film thickness as a function of exposure dose was measured by a Nanospec film thickness measurement tool and plotted as the contrast curve shown in FIG. 1.

Lithographic Example 2

Figure 2:
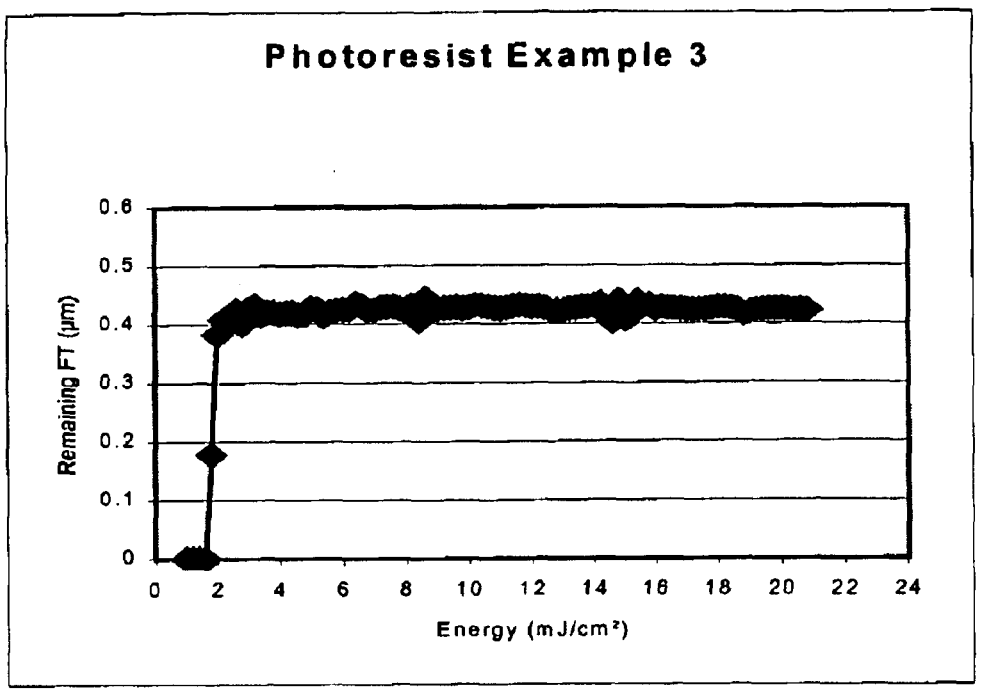
FIG. 2 shows the contrast curve for Photoresist Example 3.
Figure 3:
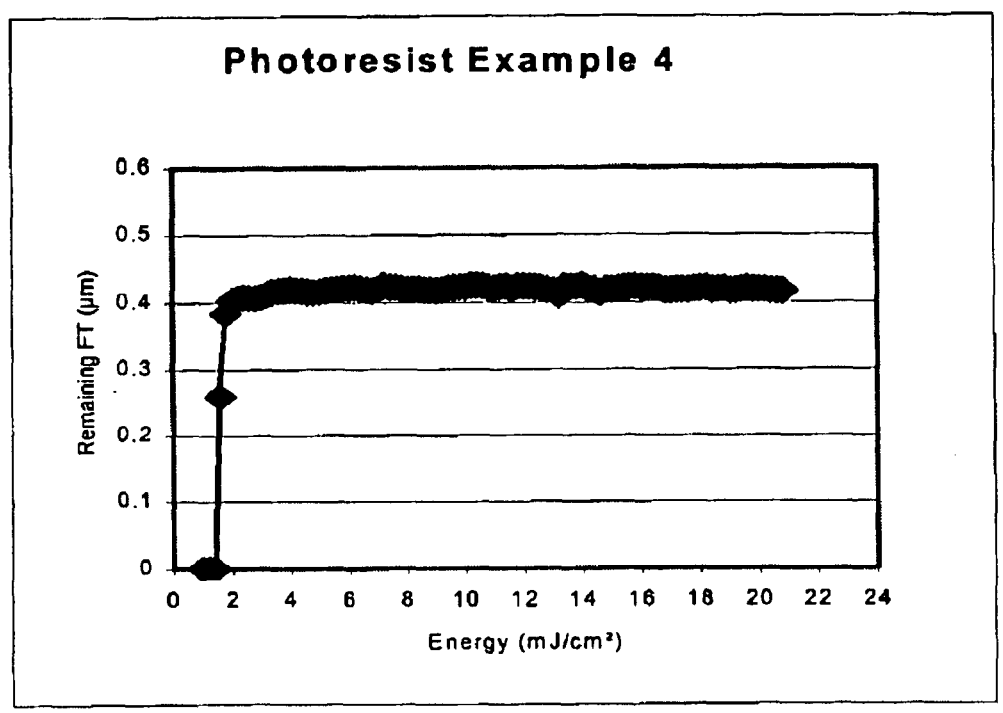
FIG. 3 shows the contrast curve for Photoresist Example 4.

Photoresist Example 3 and 4 were coated on silicon wafers to give 0.48 µm+/−0.1 µm thickness. The wafers were exposed on ISA 0.60 NA 193 nm mini Stepper then re-baked at 130° C. for 70 seconds on a hot plate in a contact mode. The wafers were immersed in AZ® R2 developer for 16.5 seconds. This step was followed by deionized water rinse for 60 seconds and dried. The photoresist film thickness as a function of exposure dose were measured by a Nanospec film thickness measurement tool and plotted as the contrast curves in FIGS. 2 and 3 for Photoresist Example 3 and 4 respectively.

What is claimed is:

1. A negative aqueous photoresist composition, comprising:

a) a polymer comprising at least one unit with structure (1)

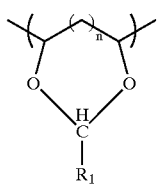

(1)

where $R_1$ is hydrogen or $(C_1–C_4)$ alkyl and n=1–4;

b) a water-soluble photoactive compound;

c) a crosslinking agent; and, d) a solvent composition, and further where the photoactive compound has structure (2).

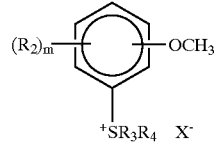

(2)

where, $R_2$ is hydrogen, alkyl, —O(alkyl, -(alkyl)OH hydroxyphenyl or multihydroxyphenyl, $R_3$ and $R_4$ are independently $(C_1–C_4)$ alkyl, m=1–3, and, $X^-$ is an anion.

2. The photoresist composition according to claim 1, where solvent composition is water or a mixture of water and a $(C_1–C_4)$ alkyl alcohol.

3. The photoresist composition according to claim 2, where the alcohol is isopropanol.

4. The photoresist composition according to claim 1, where the polymer contains additional nonaromatic units.

5. The photoresist composition according to claim 4, where the nonaromatic units are selected from a group consisting of ethylenic alcohol, ethylenic pyrollidone, ethylenic acetate, and methylene alcohol.

6. The photoresist composition according to claim 1, where the polymer contains at least 10 mole % of the unit of structure 1.

7. The photoresist composition according to claim 1, where n=1 and $R_1$ is selected from methyl, ethyl, propyl and butyl.

8. The photoresist composition according to claim 1, where the photoactive compound is (4-methoxyphenyl) dimethylsufonium trifluoromethanesulfonate.

9. The photoresist composition according to claim 1, where the crosslinker is selected from melamine resins, urea resins and glycolurils.

10. A process for imaging a negative photoresist comprising the steps of:

a) forming on a substrate a negative aqueous photoresist composition comprising:

i) a polymer comprising at least one unit with structure (1)

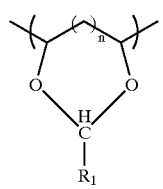

(1)

where $R_1$ is hydrogen or $(C_1–C_4)$ alkyl and n=1–4;

ii) a water-soluble photoactive compound;

iii) a crosslinking agent; and, iv) a solvent composition;

b) image-wise exposing the photoresist coating where the image-wise c) postexposure baking the photoresist coating; and d) developing the photoresist coating with a developer.

11. The process according to claim 10, where the developer is selected from water, a mixture of water and a $(C_1–C_4)$ alkyl alcohol, mixture of water and surfactant, and an aqueous base solution.

12. The process according to claim 11, where the alcohol is isopropanol.

* * * * *